(12) United States Patent
Lueck

(10) Patent No.: US 6,795,945 B2
(45) Date of Patent: Sep. 21, 2004

(54) METHOD AND ARRANGEMENT FOR TESTING DIGITAL CIRCUITS

(75) Inventor: Volker Lueck, Auenwald (DE)

(73) Assignee: Robert Bosch GmbH, Stuttgart (DE)

( * ) Notice: Subject to any disclaimer, the term of this patent is extended or adjusted under 35 U.S.C. 154(b) by 326 days.

(21) Appl. No.: 09/901,377

(22) Filed: Jul. 9, 2001

(65) Prior Publication Data
US 2002/0083388 A1 Jun. 27, 2002

(30) Foreign Application Priority Data
Jul. 8, 2000 (DE) .......................................... 100 33 349

(51) Int. Cl.[7] .............................................. G01R 31/28
(52) U.S. Cl. ..................................... 714/733; 714/727
(58) Field of Search ................................ 714/733, 726, 714/727, 734, 724

(56) References Cited

U.S. PATENT DOCUMENTS 5,677,916 A  * 10/1997  Nozuyama ................... 714/733
6,327,685 B1 * 12/2001  Koprowski et al. ......... 714/733

* cited by examiner

Primary Examiner—Albert Decady
Assistant Examiner—John P Trimmings
(74) Attorney, Agent, or Firm—Kenyon & Kenyon

(57) ABSTRACT

A method and an arrangement for testing digital circuits having at least one circuit logic and memory elements, which are interconnected to form at least one shift chain, in which test vectors are inserted into the shift chain and result vectors are retrieved from the shift chain. In at least one part of the shift chain, values from the memory elements are fed back to logic units, and the feedback values are combined with updated output values of the circuit logic in the logic units, and output values of the logic units are stored as internal test vectors in the memory elements in an internal test mode.

14 Claims, 2 Drawing Sheets

METHOD AND ARRANGEMENT FOR TESTING DIGITAL CIRCUITS

FIELD OF THE INVENTION

The present invention relates to a method for testing digital circuits having at least one circuit logic and memory elements, which are interconnected to form at least one shift chain, test vectors being inserted into the shift chain and result vectors being retrieved from the shift chain, and further relates to an arrangement for testing digital circuits having at least one circuit logic and memory elements which are interconnected to form at least one shift chain.

BACKGROUND INFORMATION

For the detection of faults in digital integrated circuits, test data may be fed to the circuits and the output data resulting from the test data and its processing within the digital circuits can be analyzed. For this purpose, memory elements, which may be components of the implementation to be tested, are interconnected to form long shift chains and the test data is inserted serially into these test chains as test vectors. Such methods may be referred to as "full scan" or "scan test." These methods may be basically well suited to test digital integrated circuits, since, in principle, any scenarios with respect to the logic can be simulated and since, moreover, the memory elements, which are generally embodied as flip-flops, can be used efficiently in a dual function (as components of the digital circuit or as components of the shift chain). However, it must be noted that a considerable amount of time may be required for the test procedure due to the serial operation during insertion or during retrieval.

SUMMARY OF THE INVENTION

In an exemplary method, values from memory elements are fed back to logic units in at least one part of the shift chain, the feedback values are combined with updated output values of the circuit logic in the logic units, and in an internal test mode output values of the logic units are stored as internal test vectors in memory elements of the shift chain.

It is thus believed that the exemplary method of the present invention may provide an internal test mode in which the serial insertion and retrieval of test vectors may be eliminated. The provision of logic units and the combination of feedback values of the circuit logic with updated output values of the circuit logic taking place in them is believed to allow for producing a test vector having the character of a random value within the circuit.

Since the output values are stored in the memory elements in the internal test mode, upon completion of the internal test mode, it is believed that a significant value is available in the memory elements which provides information concerning the processes during the internal test mode. This significant value is also referred to as a signature, which may be useful in particular with respect to sporadically occurring circuit faults since even these are reflected in the signature. Therefore, it is believed that a fault can be largely isolated by retrieving and analyzing the signature.

The logic units may be assigned to memory elements of a shift chain, values from the memory elements being fed back to several logic units and the output values of the logic units being stored in the assigned memory elements. Thus, based on the unambiguous assignment between logic units and memory elements, it is established which information is contained in a particular memory element. Moreover, it is believed that the multiple feedback favors the generation of the random-like test vectors.

Subsequent to the internal test mode, a test vector may be inserted into a shift chain in a test scan mode and the output values of the logic units stored in the shift chain are retrieved. After an internal test mode, a conventional test scan mode may be switched over to either by inserting a calculated test vector or a random vector generated in an external module into the shift chain. Simultaneously, the retrieval of the shift chain subsequent to the internal test mode provides for detecting the signature which provides information concerning circuit faults occurring during the internal test mode.

Subsequent to a test scan mode, the test vector may be fed to the circuit logic and processed by the circuit logic and the output data of the circuit logic may be stored in memory elements of a shift chain. This corresponds to an operation in a conventional test method so that the invention can be advantageously combined with test methods of the related art.

Subsequent to a storage of output data of the circuit logic in memory elements of a shift chain in a test scan mode, a test vector may be inserted into a shift chain and the output data of the circuit logic stored in the memory elements of the shift chain may be retrieved. This is also an operation which is already used in methods of the related art. Now, however, both the output data of the circuit logic as a result of a conventional test scan mode and additionally the results of the internal test mode are available. A test of digital integrated circuits can thus be performed more efficiently and should yield more meaningful results.

Subsequent to a storage of output data of the circuit logic in memory elements of a shift chain in a test scan mode, the output data of the circuit logic stored in the memory elements of the shift chain may be retrieved. It is thus not necessary to insert a new test vector into the shift chain when the output data resulting from the test scan mode is retrieved. Termination of the test scan mode is prepared in this manner.

Accordingly, in an advantageous manner, it is possible that subsequent to a test scan mode, the digital circuit switches over to its normal operation. If no test vectors input from outside are present in the shift chain and if, moreover, the internal test mode is not activated, the memory elements can switch over to their normal function within the circuit and thus make a normal operation available.

The internal test mode may last for m clock pulses so that m internal test vectors are generated. The number m and accordingly the duration of the internal test mode may be selected to be more or less of any size. It is thus possible to optimize the number of clock pulses m with respect to the significance of the signature and the total duration of the test.

One phase of a test scan mode may last for n clock pulses so that a test vector with n components is inserted and retrieved. This corresponds to the known methods. The combination of the test scan mode for n clock pulses with the internal test mode for m clock pulses, however, considerably increases the relevance of the test results obtained in a specific time period.

The test vector may be fed to the circuit logic during a clock pulse. One clock pulse is sufficient to feed the test vector to the circuit logic in parallel after the insertion. Subsequent to this, it is immediately possible to shift to a different function which serves the purpose of optimizing the process time.

An exemplary embodiment and/or exemplary method involve the fact that at least one part of the shift chain is assigned to logic units, outputs of the memory elements of the shift chain are connected to inputs of logic units, and output values of a logic unit can be fed to inputs of memory elements. In addition to the coupling of the memory elements to an overall shift chain, local sub-chains can also be formed. The updated test results as well as the results of an internal test mode are available here in the form of a signature, from which it is possible to form new signature values by combining the updated test results with the previous memory values. Such a local feedback-signature forming logic makes it possible to determine particularly sound results from circuit elements connected upstream; in addition, the results of the local feedback-signature forming logic are used as test vectors for additional circuit components. Basically, it is within the context of the invention that the entire shift chain is equipped with local feedback-signature forming logics. However, it can be of particular advantage if the provision of local feedback-signature forming logics is limited to subchains since this limits the additional expense for circuitry within the digital integrated circuit.

The logic units may be assigned to memory elements of a shift chain, one output of a memory element being connected to inputs of a plurality of logic units and it only being possible to feed output values of the logic units to inputs of assigned memory elements. Since the outputs of one memory element are connected to inputs of a plurality of logic units, random numbers can be produced internally in a particularly efficient manner. The unambiguous assignment of output values of the logic units to inputs of assigned memory units is in accordance with the significance of the signature determined during the internal test mode.

Output values of the circuit logic may be fed to inputs of logic units and memory elements, so that the exemplary arrangement according to the present invention may be operated optionally in an internal test mode, a test scan mode or normally. If the output values of the circuit logic are fed to inputs of the logic units, the output values can be combined with the feedback data of the memory elements. Consequently, the internal test mode is present. Otherwise, if the output values of the circuit logic are fed to the inputs of the memory elements without the detour via the logic units, this can be used for the retrieval of test results from the circuit logic; in addition, the memory elements, which, for example, are parts of the integrated digital circuit as flip-flops, can perform their normal operation.

Output values of the circuit logic and output values of the logic units may be fed to inputs of first multiplexers. A particular multiplexer can then decide, on the basis of the state of a signal applied to the multiplexer externally, if the output values of the logic units will be further processed—this takes place in the internal test mode—or if the results of the circuit logic will be passed on to the memory elements—this state is present during the "conventional" test scan method or during normal operation.

Output values of the first multiplexers and output values of memory elements may be fed to inputs of second multiplexers, and output values of the second multiplexers can be fed to inputs of memory elements. Controlled by an additional external signal, a second multiplexer can thus decide if an output signal of a logic unit or an output value of the circuit logic will be fed to a memory element or if the memory elements will be used in the form of a shift chain so that the output data value of a particular preceding memory element in the shift chain is fed to a memory element.

The exemplary method and/or exemplary embodiment of the present invention involve the fact that by providing local logic units designed as feedback-signature forming logics, it is believed that the test time for a digital integrated circuit may be reduced considerably. Random vectors are generated internally so that it is believed that no external modules should be necessary for this purpose, and the logic units also aid in the formation of a signature which may be of particular significance for identifying the time and location of a fault.

DETAILED DESCRIPTION

Figure 1:
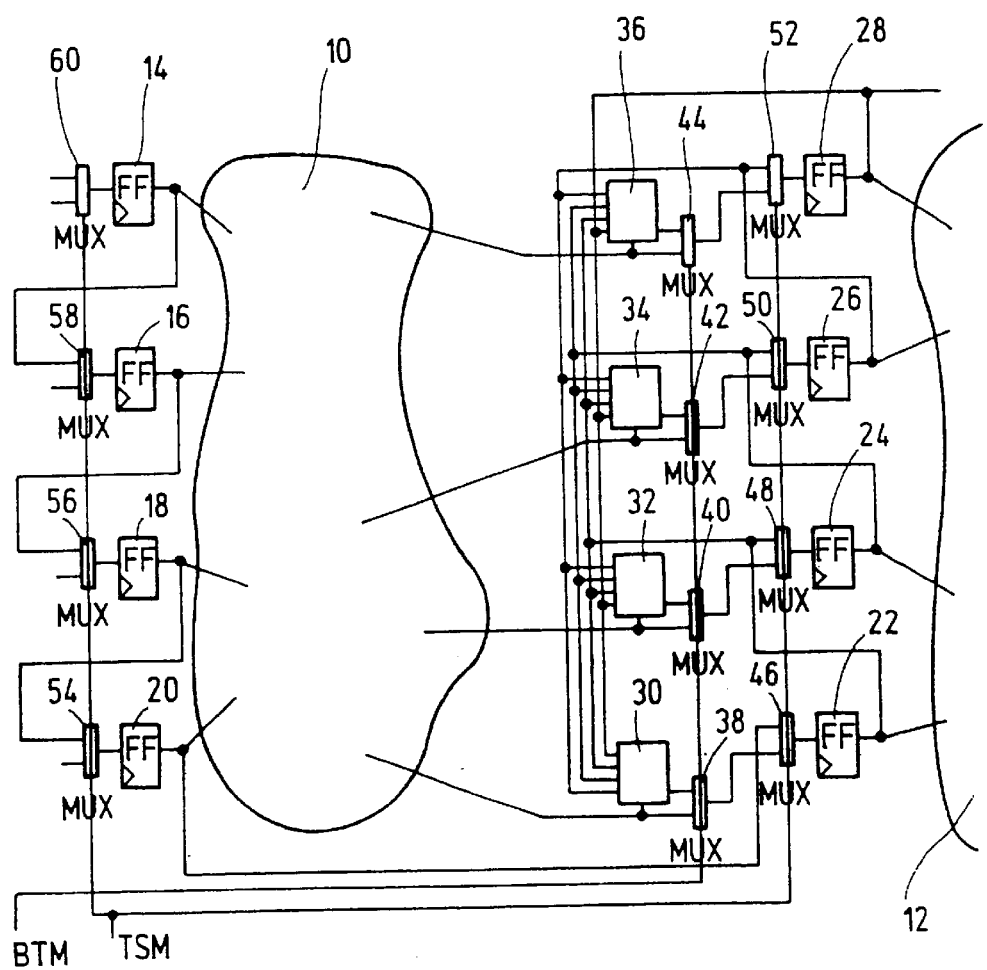
FIG. 1 shows an exemplary arrangement according to the present invention.

In FIG. 1, only even reference numerals are used, and therefore, whenever statements are made in this specification regarding a particularly range of reference numerals used in FIG. 1, it should be understood that only even reference numerals falling in that particular range are indicated. For example, "logic units 30–36" in reference to FIG. 1 indicates logic units 30, 32, 34, and 36.

FIG. 1 shows an exemplary arrangement according to the present invention in diagrammatic form. A circuit logic 10 is symbolically indicated by a curved boundary line. Moreover, one part of a second circuit logic 12 can be seen. Memory elements 14–28 designed as flip-flops are provided. Logic units 30–36 are assigned to part of memory elements 22–28. There is an unambiguous assignment of memory elements 22–28 to logic units 30–36; for example, logic unit 32 is assigned to memory element 24. A first multiplexer 38–44 and a second multiplexer 46–52 are each located between memory elements 22–28 and logic units 30–36 assigned to one another.

Each of first multiplexers 38–44 receives two input signals, one input signal being an output signal of circuit logic 10 and the other input signal being an output signal of an assigned logic unit 30–36. For example, multiplexer 40 receives one of its input signals from logic unit 32. The output signal of respective first multiplexers 38–44 is an input signal for respective second multiplexers 46–52. For example, first multiplexer 40 supplies an input signal for second multiplexer 48. An additional input signal for second multiplexers 46–52 is supplied by the output signals of memory units 14–26, which precede the respective second multiplexers 46–52 in the shift chain. For example, the output signal of memory element 22 is applied to the input of multiplexer 48.

Second multiplexers 46–52 of the sub-chain having memory elements 22–28 correspond to multiplexers 54–60 of sub-chain 14–20 without logic units. In the latter [sub-chain], multiplexers 54–60 are also used for switching between a test scan mode and normal operation. The output signal of a second multiplexer 46–60 is the input signal of the respective memory elements 14–28. First multiplexers 38–44 are triggered by a first signal BTM. Second multiplexers 46–60 are triggered by a second signal TSM. Depending on the state of these signals BTM, TSM, the one or the other output of multiplexers 38–60 is passed on to its output. It should be noted that the arrangement of FIG. 1 is only exemplary. In particular, the individual assignment paths, for example, logic unit 32, multiplexer 40, multiplexer 48, memory element 24 and logic unit 34, multiplexer 42, multiplexer 50, and memory element 26 do not need to be identical. Rather, both the interconnection of the elements as well as the elements themselves may vary.

Figure 2:
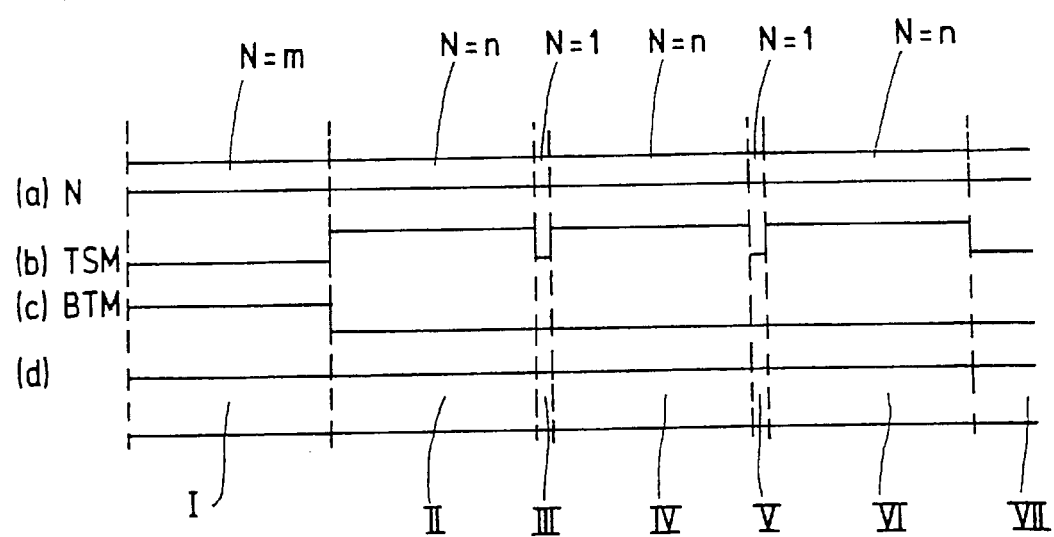
FIG. 2 shows an exemplary timing diagram.

The function of the exemplary arrangement according to FIG. 1 can be illustrated based on the timing diagram of FIG. 2. Line (a) of FIG. 2 indicates the number of clock pulses N in the periods, each of which is identified by broken vertical lines. Line (b) indicates the state of signal TSM, which represents a changeover signal into the test scan mode. Line (c) shows the variation of signal BTM, which is a changeover signal into the internal test mode ("built in test mode"). In line (d), Roman numerals correspond to functions performed by the circuit according to FIG. 1 as a function of signals TSM and BTM.

Period I: Here, m test vectors are applied to a digital circuit 10, 12 to be tested. The duration of Period I is m clock pulses. During this time, signal TSM is in a logical zero state while signal BTM is in a logical on state. The result of the logical zero state of signal TSM is that memory elements 14–28 do not function as a shift chain. Rather, the output of multiplexer 40 is applied to the inputs of, for example, memory element 24 via multiplexer 48.

Since, moreover, signal BTM is in a logical on state, each of the upper inputs of first multiplexers 38–44 are turned on. This means, for example, that the output of logic unit 32 is applied to the input of memory unit 24 via multiplexers 40, 48. The output of this exemplary memory unit 24 is now fed back to inputs of logic units 30–36. The outputs of circuit logic 10 are applied to these logic units 30–36 via additional inputs. The combination of the data fed back from memory elements 22–28 with the output data of circuit logic 10 forms a signature in logic units 30–36, which are also identified as feedback-signature forming logic. The signature is transmitted to memory elements 22–28 via the multiplexers.

With each clock pulse, there is a new feedback and a new logical processing in logic units 30–36. In this manner, after m clock pulses, values are present in memory elements 22–28 which are dependent on the initial state of a test vector present before the start of the m clock pulses, a relevance of this signature for the operations during the m clock pulses being present simultaneously.

Period II: Here, the signature is retrieved from memory elements 22–28. In addition, a test vector is inserted into memory elements 14–28. For this purpose, signal TSM is set to a logical on state. The result of this is that the outputs of the first multiplexers, i.e., for example, multiplexer 40 are no longer switched through to the memory elements, for example memory element 24. Rather, memory elements 14–28 are interconnected to form a complete shift chain.

Moreover, the feedback of memory elements 22–28 to logic units 30–36 is no longer relevant, since signal BTM is in a logical zero state. Consequently, a test vector is available in memory elements 14–28 after n clock pulses.

Period III: In a single subsequent clock pulse, the test vector present in memory elements 14–28 is passed on to circuit logic 10, 12, a single clock pulse being required for this purpose. During this clock pulse, signal BTM remains in a logical zero state. Signal TSM is set to a logical zero state during this time.

Period IV: Subsequently, signal TSM is again set to a logical on state. With a logical zero state of signal BTM, the result of this is that a test vector can be inserted again, while the result from the test vector inserted during Period II and from the operations in the circuit logic during Period III is retrieved.

Period V: During this period, a test vector is again passed on to circuit logic 10, 12, specifically the one that was inserted during Period IV. For this purpose, signal BTM again stays in a logical zero state while signal TSM is set to logical zero.

Period VI: In the n clock pulses of Period VI, the test result which results from the test vector applied during Period IV and the operations in the circuit logic during Period V is retrieved. For this purpose, signal TSM is again set to a logical on state while signal BTM stays at logical zero. The insertion of a test vector is no longer repeated.

Period VII: Here, both signal TSM and signal BTM are in a logical zero state with the result that the circuit assumes its normal operation.

Subsequent to the normal operation, an internal test mode may again be generated by switching signal BTM to on. However, depending on the existing requirements, a test scan mode may also be brought about by switching signal TSM into the on state. Any desired combinations and sequences of test scan mode and internal test mode periods are conceivable, depending on the requirements. Likewise, the circuits can be optimized by the special design of logic units 30–36 or the circuitry as well as by the timing of the individual periods.

The above description of the exemplary embodiments according to the present invention is illustrative and not limiting, since various changes and modifications may be made in connection with the present invention(s) as claimed without departing from the scope thereof.

What is claimed is:

1. A method for testing a digital circuit, the digital circuit including at least one logic circuit and memory elements interconnected to form at least one shift chain, the method comprising:

inserting at least one test vector into the at least one shift chain;

retrieving at least one result vector from the at least one shift chain;

feeding back feedback values from the memory elements to at least one logic unit;

combining the feedback values with at least one updated output value of the at least one circuit logic in the at least one logic unit;

storing, in an internal test mode, the at least one updated output value of the at least one logic unit as at least one internal test vector in the memory elements of the at least one shift chain.

2. The method of claim 1, wherein:

the at least one logic unit includes a plurality of logic units assigned to assigned memory elements of a shift chain of the at least one shift chain;

values from the assigned memory elements of the shift chain are fed back to the plurality of logic units; and the output values of the plurality of logic units are stored in the assigned memory elements.

3. The method of claim 1, further comprising:

subsequent to the internal test mode, in a test scan mode, inserting a test vector into the at least one shift chain;

wherein the at least one updated output value of the at least one logic unit stored in the at least one shift chain are retrieved.

4. The method of claim 3, wherein:

subsequent to the test scan mode, the at least one test vector is fed to the at least one logic circuit for processing by the at least one logic circuit; and output data of the at least one logic circuit are stored in the memory elements of the at least one shift chain.

5. The method of claim 1, further comprising:

inserting, in a test scan mode, a test vector of the at least one test vector into a shift chain of the at least one shift chain, the inserting being subsequent to storing output data of the at least one logic circuit in the memory elements of the at least one shift chain;

wherein output data of the at least one logic circuit stored in the memory elements of the at least one shift chain are retrieved.

6. The method of claim 1, further comprising:

storing output data of the at least one logic circuit in the memory elements of the at least one shift chain in a test scan mode;

wherein the output data of the at least one logic circuit stored in the memory elements of the at least one shift chain are retrieved.

7. The method of claim 1, wherein the digital circuit assumes its normal operation subsequent to a test scan mode.

8. The method of claim 1, wherein the internal test mode lasts form clock pulses for generating m internal test vectors.

9. The method of claim 1, wherein one phase of a test scan mode lasts for n clock pulses for one of inserting and retrieving a test vector having n components.

10. The method of claim 1, wherein at least one test vector fed to the at least one logic circuit occurs during a clock pulse.

11. An arrangement for testing a digital circuit, the digital circuit including at least one logic circuit and memory elements interconnected to form at least one shift chain, comprising:

an assigning arrangement for assigning at least one part of the at least one shift chain to logic units;

a connecting arrangement for connecting outputs of the memory elements to inputs of the logic units; and a feeding arrangement for feeding output values of a logic unit of the logic units to inputs of the memory elements;

wherein output values of the at least one logic circuit are fed to inputs of the logic units and to the memory elements.

12. The arrangement of claim 11, wherein:

the logic units are assigned to assigned memory elements of the at least one shift chain;

one output of a memory element of the memory elements is connected to inputs of the logic units; and output values of the logic units are fed only to inputs of the assigned memory elements.

13. An arrangement for testing a digital circuit, the digital circuit including at least one logic circuit and memory elements interconnected to form at least one shift chain, comprising:

an assigning arrangement for assigning at least one part of the at least one shift chain to logic units;

a connecting arrangement for connecting outputs of the memory elements to inputs of the logic units; and a feeding arrangement for feeding output values of a logic unit of the logic units to inputs of the memory elements;

wherein output values of the at least one logic circuit and output values of the logic units are fed to inputs of first multiplexers.

14. The arrangement of claim 13, wherein:

output values of the first multiplexers and output values of the memory elements are fed to inputs of second multiplexers; and output values of the second multiplexers are fed to inputs of the memory elements.

* * * * *